United States Patent
Nakagome et al.

(10) Patent No.: US 9,307,643 B2
(45) Date of Patent: Apr. 5, 2016

(54) SUBSTRATE WITH BUILT-IN ELECTRONIC COMPONENT AND METHOD FOR MANUFACTURING SUBSTRATE WITH BUILT-IN ELECTRONIC COMPONENT

(71) Applicant: IBIDEN CO., LTD., Ogaki-shi (JP)

(72) Inventors: Hisayuki Nakagome, Ogaki (JP); Toshiki Furutani, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/565,763

(22) Filed: Dec. 10, 2014

(65) Prior Publication Data
US 2015/0163919 A1    Jun. 11, 2015

(30) Foreign Application Priority Data
Dec. 10, 2013    (JP) .................. 2013-255047

(51) Int. Cl.
| | |
|---|---|
| H05K 1/11 | (2006.01) |
| H05K 3/42 | (2006.01) |
| H01G 4/30 | (2006.01) |
| H05K 3/46 | (2006.01) |
| H05K 1/18 | (2006.01) |
| H05K 3/40 | (2006.01) |
| H01G 4/33 | (2006.01) |
| H01G 4/40 | (2006.01) |
| H01G 4/232 | (2006.01) |
| H01L 23/13 | (2006.01) |
| H01L 23/48 | (2006.01) |
| H01G 4/12 | (2006.01) |
| C23C 18/00 | (2006.01) |

(52) U.S. Cl.
CPC .............. *H05K 1/115* (2013.01); *H01G 4/232* (2013.01); *H01G 4/30* (2013.01); *H01G 4/33* (2013.01); *H01G 4/40* (2013.01); *H01L 23/13* (2013.01); *H01L 23/48* (2013.01); *H05K 1/183* (2013.01); *H05K 1/185* (2013.01); *H05K 3/4084* (2013.01); *H05K 3/421* (2013.01); *H05K 3/4644* (2013.01); *C23C 18/00* (2013.01); *H01G 4/12* (2013.01); *H05K 3/4602* (2013.01); *H05K 2201/09509* (2013.01); *H05K 2201/10015* (2013.01); *H05K 2203/0554* (2013.01)

(58) Field of Classification Search
CPC ....... H05K 1/112; H05K 1/113; H05K 1/114; H05K 1/115; H05K 1/116; H05K 1/183; H05K 3/4084; H05K 3/429; H05K 3/42; H05K 3/421
See application file for complete search history.

(56) References Cited

FOREIGN PATENT DOCUMENTS

| JP | 2001-223299 A | 8/2001 |
|---|---|---|
| JP | 2012-069926 A | 4/2012 |

*Primary Examiner* — Jeremy C Norris
(74) *Attorney, Agent, or Firm* — Oblon, McClelland, Maier & Neustadt, L.L.P.

(57) ABSTRACT

A substrate having a built-in electronic component includes an insulating substrate having an opening portion, a conductor pattern formed on the substrate, an electronic component accommodated in the opening portion of the substrate and having a terminal, an insulating layer formed on the substrate such that the insulating layer is covering the pattern and the component in the substrate, and multiple via conductors penetrating through the insulating layer and including a first via conductor reaching to the pattern on the substrate and a second via conductor reaching to the terminal of the component in the substrate. The pattern has a recessed connecting portion connected to the first via conductor, the terminal of the component has a recessed connecting portion connected to the second via conductor, and the recessed connecting portion of the pattern has depth which is greater than depth of the recessed connecting portion of the terminal.

20 Claims, 7 Drawing Sheets

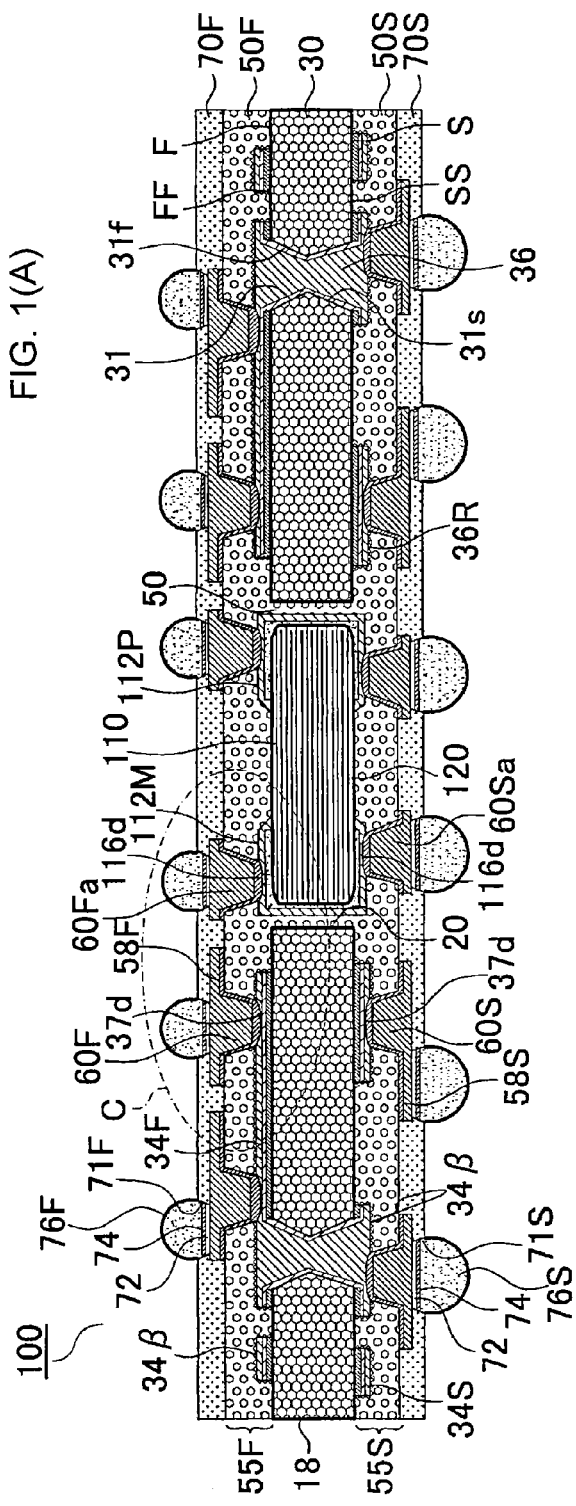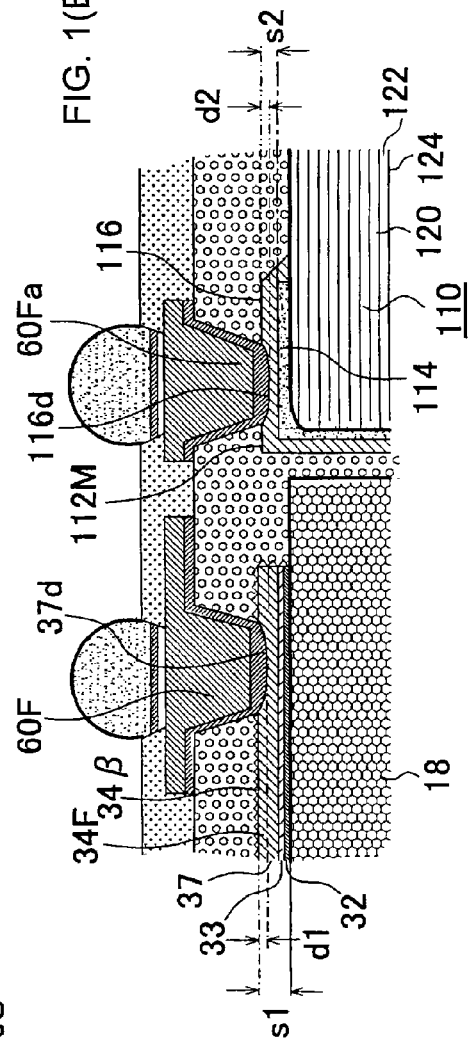

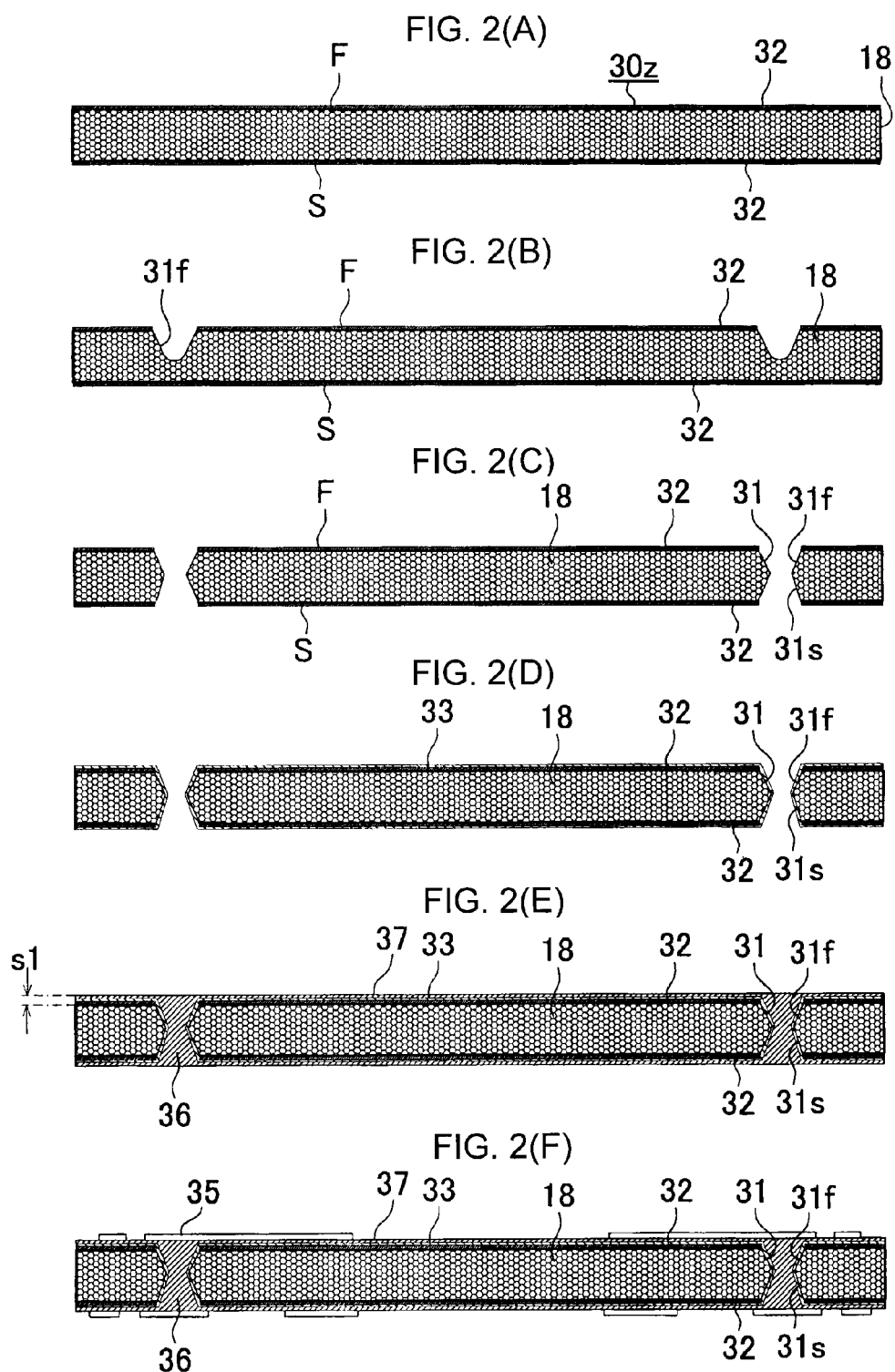

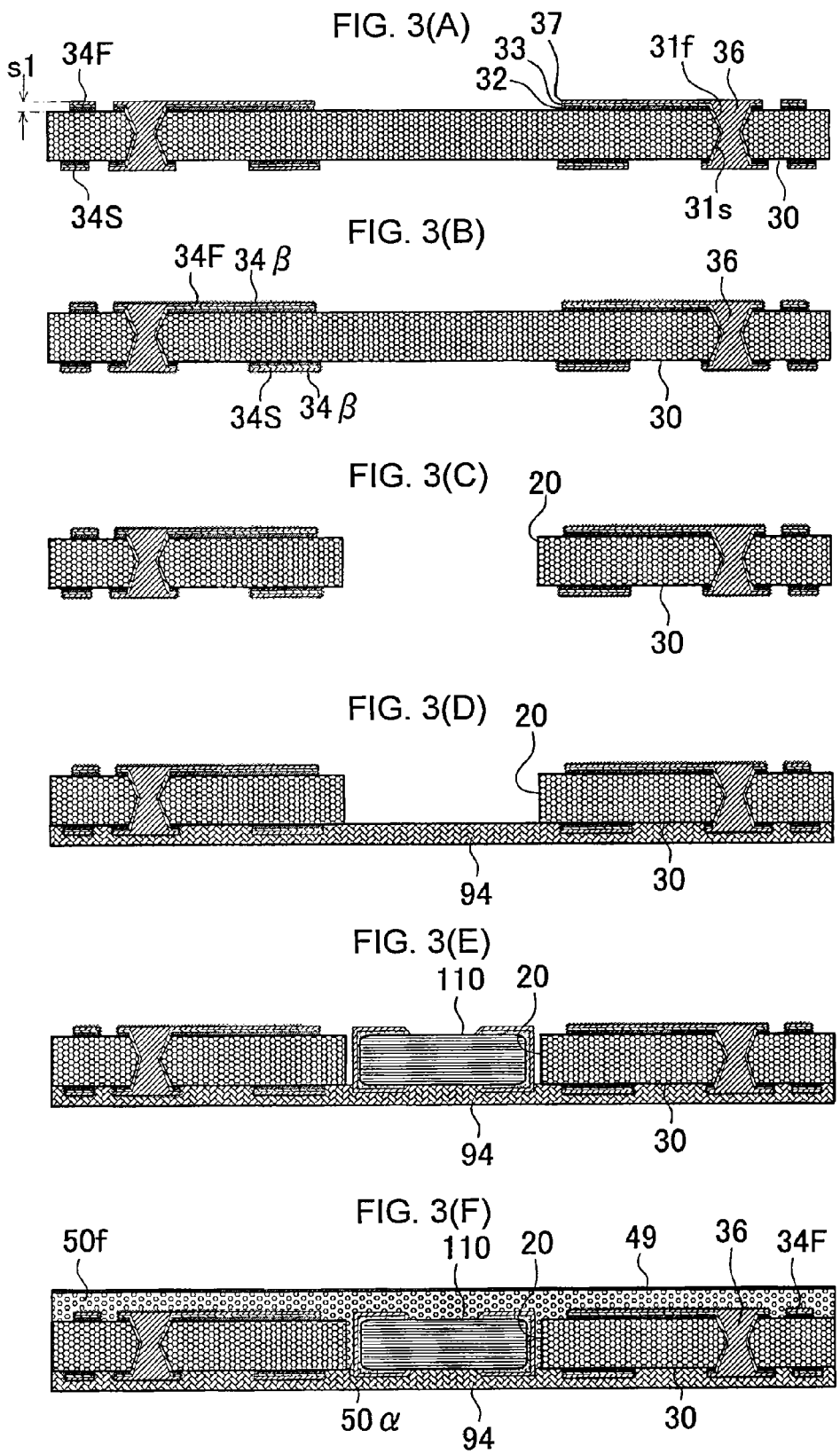

SUBSTRATE WITH BUILT-IN ELECTRONIC COMPONENT AND METHOD FOR MANUFACTURING SUBSTRATE WITH BUILT-IN ELECTRONIC COMPONENT

CROSS-REFERENCE TO RELATED APPLICATIONS

The present application is based upon and claims the benefit of priority to Japanese Patent Application No. 2013-255047, filed Dec. 10, 2013, the entire contents of which are incorporated herein by reference.

BACKGROUND OF THE INVENTION

1. Field of the Invention

The present invention relates to a substrate with a built-in electronic component that has a built-in electronic component such as a capacitor, and relates to a method for manufacturing the substrate with a built-in electronic component.

2. Description of Background Art

Japanese Patent Laid-Open Publication No. 2001-223299 describes a package substrate in which a capacitor is accommodated in an opening of a core substrate on which a conductor pattern is provided, an interlayer resin insulating layer is laminated on the core substrate and the capacitor, and the conductor pattern and an electrode of the capacitor are connected by via conductors that are formed in the interlayer resin insulating layer. The entire contents of this publication are incorporated herein by reference.

SUMMARY OF THE INVENTION

According to one aspect of the present invention, a substrate having a built-in electronic component includes an insulating substrate having an opening portion, a conductor pattern formed on the insulating substrate, an electronic component accommodated in the opening portion of the insulating substrate and having a terminal, an insulating layer formed on the insulating substrate such that the insulating layer is covering the conductor pattern on the insulating substrate and the electronic component in the opening portion of the insulating substrate, and multiple via conductors penetrating through the insulating layer and including a first via conductor reaching to the conductor pattern on the insulating substrate and a second via conductor reaching to the terminal of the electronic component in the opening portion of the insulating substrate. The conductor pattern has a recessed connecting portion connected to the first via conductor, the terminal of the electronic component has a recessed connecting portion connected to the second via conductor, and the recessed connecting portion of the conductor pattern has a depth which is greater than a depth of the recessed connecting portion of the terminal of the electronic component.

According to another aspect of the present invention, a method for manufacturing a substrate having a built-in electronic component includes forming a conductor pattern on an insulating substrate, forming an opening portion in the insulating substrate, accommodating an electronic component having a terminal in the opening portion of the insulating substrate, laminating an insulating layer on the insulating substrate such that the insulating layer covers the conductor pattern on the insulating substrate and the electronic component in the opening portion of the insulating substrate, laminating a copper foil on the insulating layer, irradiating laser upon the copper foil such that multiple openings including a first opening penetrating through the copper foil and the insulating layer and reaching to the conductor pattern and a second opening penetrating through the copper foil and the insulating layer and reaching to the terminal of the electronic component are formed, applying etching on the copper foil such that the copper foil is removed from the insulating layer, a recessed connecting portion is formed on the terminal, and a recessed connecting portion is formed on the conductor pattern such that the recessed connecting portion of the conductor pattern has a depth which is greater than a depth of the recessed connecting portion of the terminal, and forming multiple via conductors including a first via conductor formed in the first opening such that the first via conductor connects to the recessed connecting portion of the conductor pattern and a second via conductor formed in the second opening such that the second via conductor connects to the recessed connecting portion of the terminal of the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A and 1B illustrate cross-sectional views of a substrate with a built-in electronic component according to a first embodiment of the present invention.

FIG. 2A-2F illustrate manufacturing process diagrams of the substrate with a built-in electronic component of the first embodiment.

FIG. 3A-3F illustrate manufacturing process diagrams of the substrate with a built-in electronic component of the first embodiment.

DETAILED DESCRIPTION OF THE EMBODIMENTS

Figure 4A:
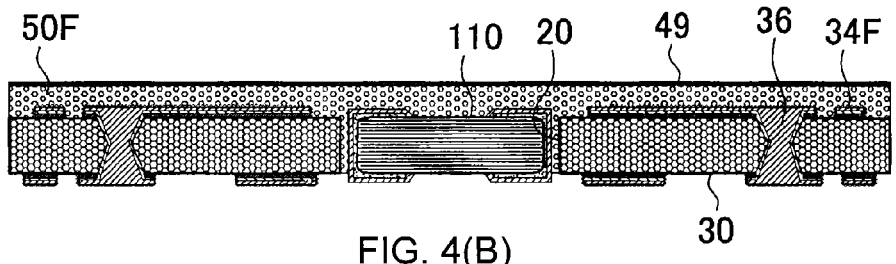
FIG. 4A-4E illustrate manufacturing process diagrams of the substrate with a built-in electronic component of the first embodiment.

The embodiments will now be described with reference to the accompanying drawings, wherein like reference numerals designate corresponding or identical elements throughout the various drawings.

A cross section of a substrate 100 with a built-in electronic component according to a first embodiment of the present invention is illustrated in FIG. 1A. The substrate 100 with a built-in electronic component has a core substrate 30 that has a first surface (F) and a second surface (S) that is on an opposite side of the first surface.

The core substrate 30 has a cavity (opening part) 20. In the present embodiment, the cavity 20 penetrates through the core substrate 30.

Inside the cavity 20, a capacitor 110 is accommodated. A resin 50 is filled in space between a side wall of the cavity 20 and the capacitor 110. As a result, the capacitor 110 is fixed inside the cavity 20.

A conductor layer (34F) is formed on the first surface (F) of the core substrate 30, and a conductor layer (34S) is formed on the second surface (S) of the core substrate 30. The core substrate 30 has multiple through holes 31, and inside each of the through holes 31, a through hole conductor 36 connecting the conductor layers (34F, 34S) is formed.

The through hole conductor 36 is formed by filling the through hole 31 by plating. The through hole 31 is formed by a first opening part (31f) that opens to the first surface (F) of the core substrate 30 and a second opening part (31s) that opens to the second surface (S). The first opening part (31f) is tapered from the first surface toward the second surface, and the second opening part (31s) is tapered from the second surface toward the first surface. The first opening part (31f) and the second opening part (31s) are connected inside the core substrate 30.

An upper side build-up layer (55F) is formed on the first surface (F) of the core substrate 30 and on the capacitor 110. The upper side build-up layer includes an insulating layer (50F) that is formed on the first surface (F) of the core substrate 30 and on the capacitor 110, a conductor layer (58F) on the insulating layer (50F), and a via conductor (60F) that is provided in the insulating layer (50F) and connects the conductor layer (58F) and the conductor layer (34F). In the insulating layer (50F), a connection via conductor (60Fa) is further provided that connects the conductor layer (58F) and electrodes (112M, 112P) of the capacitor 110.

A lower side build-up layer (55S) is formed on the second surface (S) of the core substrate 30 and on the capacitor 110. The lower side build-up layer includes an insulating layer (50S) that is formed on the second surface (S) of the core substrate 30 and on the capacitor 110, a conductor layer (58S) on the insulating layer (50S), and a via conductor (60S) that is provided inside the insulating layer (50S) and connects the conductor layer (58S) and the conductor layer (34S). Inside the insulating layer (50S), a connection via conductor (60Sa) is further provided that connects the conductor layer (58S) and electrodes (112M, 112P) of the capacitor 110.

On the upper side build-up layer (55F), a solder resist layer (70F) having openings (71F) is formed. On the lower side build-up layer (55S), a solder resist layer (70S) having openings (71S) is formed. Conductor patterns (58F, 58S) that are exposed from the openings (71F, 71S) of the solder resist layers (70F, 70S) function as pads on which solder bumps (to be described later) are formed. On the pads, metal films (72, 74) such as those of Ni/Au or Ni/Pd/Au are formed, and on the metal films, solder bumps (76F, 76S) are formed. Via the solder bump (76F) that is formed on the upper side build-up layer (55F, an IC chip is mounted on the substrate 100 with a built-in electronic component. Via the solder bump (76S) that is formed on the lower side build-up layer (55S), the substrate 100 with a built-in electronic component is mounted on a motherboard.

A portion surrounded by a circle (C) in FIG. 1A is enlarged and is illustrated in FIG. 1B.

The capacitor 110 is formed of a multilayer ceramic capacitor (MLCC) of a small size and a large capacity. The capacitor is formed of a body part 120 and the electrodes (112P, 112M), the body part 120 being formed by alternately laminating dielectric layers 122 that are formed mainly from $BaTiO_3$ and internal electrodes 124 that are made of Ni. The electrodes (112P, 112M) of the capacitor 110 are each formed by providing Ni paste 114 in a manner in contact with the internal electrodes 124 that extend to an end part of the body part 120 and covering the Ni paste 114 with a Cu plating film 116.

The connection via conductors (60Fa, 60Sa) are connected to the Cu plating film 116 on a surface of the electrode (112M) of the capacitor. The Cu plating film 116 is formed by copper pyrophosphate plating. A bottom part of each of the connection via conductors (60Fa, 60Sa) has a substantially hemispherical shape, and is in contact with a substantially hemispherical recess (116d) of the Cu plating film 116. A recess depth (d2) from a surface of the Cu plating film 116 to a deepest part of the substantially hemispherical recess (116d) is 2-6 μm, and a thickness (s2) of the Cu plating film 116 is 8-15 μm.

The conductor pattern (34F) is formed in a three-layer structure including a copper foil 32, an electroless plating film 33 and an electrolytic plating film 37. The electrolytic plating film 37 of a surface layer is formed by copper sulfate plating. The via conductors (60F, 60S) are connected to the electrolytic plating films 37 of the surface layers of the conductor patterns (34F, 34S). A bottom part of each of the via conductors (60F, 60S) has a substantially hemispherical shape, and is in contact with a substantially hemispherical recess (37d) of the electrolytic plating film 37. A recess depth (d1) from a surface of the electrolytic plating film 37 to a deepest part of the substantially hemispherical recess (37d) is 2-7 μm, and a thickness (s1) of the conductor pattern (34F) is 10-20 μm.

In the first embodiment, connecting parts of the via conductors (60F, 60S) and the conductor patterns (34F, 34S), and connecting parts of the connection via conductors (60Fa, 60Sa) and the terminals (112M, 112P) of the capacitor, are recessed. The depth (d1) of the recess (37d) of each of the conductor patterns (34F, 34S) on the resin core substrate 30 is deeper than the depth (d2) of the recess (116d) of each of the terminals (112M, 112P) of the ceramic capacitor. Due to a difference between coefficients of thermal expansion of the interlayer resin insulating layers (50F, 50S) and the core substrate 30, tensile stress is large in the conductor patterns (34F, 34S) on the resin core substrate, and the conductor patterns (34F, 34S) on the resin core substrate also have large amounts of displacement. On the other hand, the terminals (112M, 112P) on a highly rigid ceramic have small amounts of displacement. Therefore, by allowing the via conductors (60F, 60S) to significantly protrude into the conductor patterns (34F, 34S) and deepening the recesses (37d), the connection reliability of the via conductors (60F, 60S) that connect to the conductor patterns (34F, 34S) can be improved. The coefficient of thermal expansion of the core substrate in an X-Y direction is lower than a coefficient of thermal expansion of the ceramic capacitor in the X-Y direction.

Here, it is desirable that a ratio (d1/s1) between the depth (d1) of the recess (37d) of the conductor patterns (34F, 34S) and the thickness (s1) of the conductor patterns be 1/20 or more and 7/10 or less. The connection reliability of the conductor patterns (34F, 34S) and the via conductors (60F, 60S) is improved. On the other hand, it is desirable that a ratio between the depth (d2) of the recess (116d) of the terminals (112M, 112P) and the thickness (s2) of the plating layer 116 of the terminals be 2/15 or more and 1/4 or less. Further, it is desirable that a ratio between the depth (d2) of the recess (116d) of the terminals (112M, 112P) and the depth (d1) of the recess (37d) of the conductor patterns (34F, 34S) be 0.5 or more and less than 1. The connection reliability of the plating layer 116 of the terminals and the connection via conductors (60Fa, 60Sa) is improved.

FIG. 7A-7D illustrate manufacturing process diagrams of a capacitor of the first embodiment.

Figure 7A:
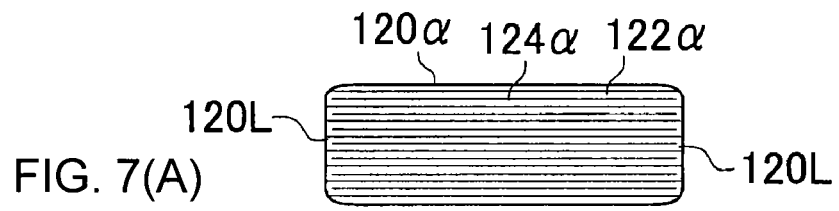
FIG. 7A-7D illustrate manufacturing process diagrams of a capacitor of the first embodiment.

(1) Dielectric layers ($122\alpha$) that are formed of $BaTiO_3$ and internal electrode layers ($124\alpha$) that are made of Ni are alternately laminated and a laminated body ($120\alpha$) is formed (FIG. 7A).

Figure 7B:
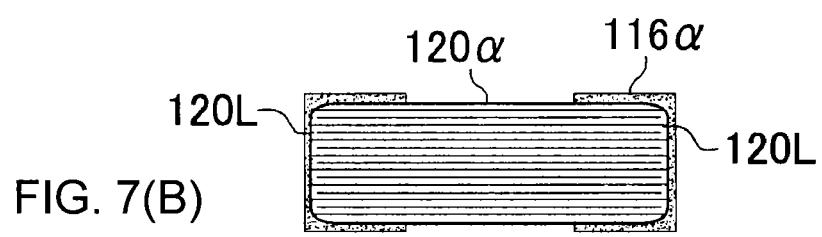

(2) A Ni paste layer ($114\alpha$) is applied to short-side sides of the laminated body in a manner in contact with the internal electrode layers ($124\alpha$) that extend to end parts of the laminated body ($120\alpha$) (FIG. 7B). Ni paste layer is mainly made of Ni powder and a TiBa base component.

Figure 7C:
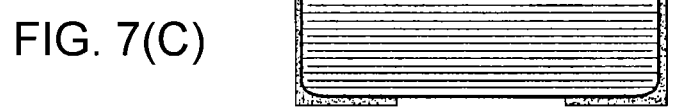

(3) The laminated body ($120\alpha$) and the Ni paste layer ($114\alpha$) are simultaneously fired, and a body part 120 and a Ni paste 114 are formed (FIG. 7C).

Figure 7D:
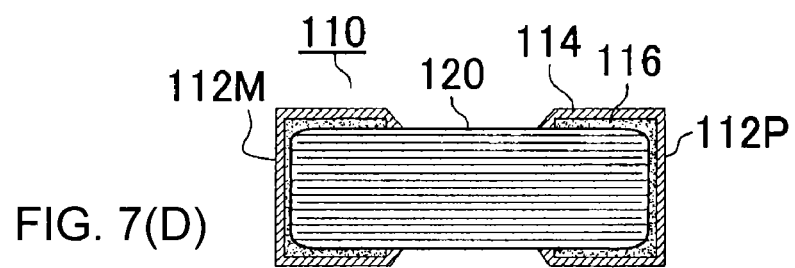

(4) By copper pyrophosphate plating using copper pyrophosphate ($Cu_7P^2O_7$) and potassium pyrophosphate ($K_4P_2O_7$), a Cu plating film 116 is coated on the Ni paste 114 and, after a water-washing step, a capacitor 110 is completed (FIG. 7D).

In the substrate with a built-in electronic component of the first embodiment, the built-in capacitor 110 is a multilayer ceramic capacitor of a large capacity. An electrode is formed of the Ni paste 114 that connects to the internal electrodes of the capacitor body and the copper plating 116 covering the conductive paste. Even the highly adhesive copper pyrophosphate plating is used for the formation of the copper plating, since the Ni paste does not contain a glass component, glass pores do not exist; and even in a vacuum state when the capacitor is built-in in a manufacturing process (to be described later), there is no scattering of potassium ions and migration does not occur between the electrodes (112P, 112M).

A method for manufacturing the substrate 100 with a built-in electronic component of the first embodiment is illustrated in FIG. 2A-6B.

(1) A double-sided copper-clad laminated plate (30z), which is formed of an insulating base material 18 and a copper foil 32 that is laminated on both sides of the insulating base material 18, is a starting material. The insulating base material has a first surface (F) and a second surface (S) that is on an opposite side of the first surface (F). It is preferable that the copper foil 32 have a thickness of 1 μm or more and 5 μm or less. A surface of the copper foil 32 is subjected to a blackening treatment (not illustrated in the drawings) (FIG. 2A).

(2) Laser is irradiated to the first surface (F) side of the insulating base material 18. A first opening part (31f) that tapers from the first surface of the insulating base material toward the second surface is formed (FIG. 2B).

(3) Laser is irradiated to the second surface (S) side of the insulating base material 18. A second opening part (31s) that tapers from the second surface of the insulating base material toward the first surface is formed (FIG. 2C). The second opening part (31s) is connected to the first opening part (31f) inside the insulating base material, and a through hole 31 for a through hole conductor is formed.

(4) By an electroless plating processing, an electroless plating film 33 is formed on an inner wall of the through hole 31 and on the copper foil 32 (FIG. 2D). It is desirable that the electroless plating film 33 have a thickness of 0.5-2 μm. It is sufficient to have a minimum thickness that allows the electroless plating film 33 to function as a seed layer in an electrolytic plating processing to be described later.

(5) By an electrolytic plating processing using copper sulfate, an electrolytic plating film 37 is formed on the electroless plating film 33. A thickness of the electroless plating film 33 on the insulating base material 18 is 8-14 μm; and a thickness (s1) of three layers including the copper foil 32, the electroless plating film 33 and the electrolytic plating film 37 is 10-20 μm. A through-hole conductor 36 is formed in the through hole. The through hole conductor 36 is formed by the electroless plating film 33 that is formed on the inner wall of the through hole and the electrolytic plating film 37 that fills the through hole (FIG. 2E).

(6) An etching resist 35 of a predetermined pattern is formed on the electrolytic plating film 37 of the surface of the core substrate 30 (FIG. 2F).

(7) The electrolytic plating film 37, the electroless plating film 33 and the copper foil 32 that are exposed from the etching resist are removed. Thereafter, the etching resist is removed, and the conductor layers (34F, 34S) and the through hole conductor 36 are formed (FIG. 3A). As described above, the thickness s1 of the conductor layers (34F, 34S) is 10-20 μm. By a CZ treatment, roughened layers (34β) are formed conductor layers (34F, 34S) (FIG. 3B). The method for forming the conductor layers on the core substrate is not limited to the above-described method. For example, the conductor layers may also be formed using a method described in FIGS. 1 and 2 of Japanese Patent Laid-Open Publication No. 2012-69926. The entire contents of this publication are incorporated herein by reference.

(8) At a central part of the insulating base material 18, an opening 20 for accommodating a capacitor is formed using laser, and the core substrate 30 is completed (FIG. 3C).

(9) A tape 94 is affixed to the second surface (S) of the core substrate 30. The opening 20 is closed by the tape (FIG. 3D). An example of the tape 94 is a PET film.

(10) On the tape 94 that is exposed by the opening 20, the capacitor 110 is placed (FIG. 3E). The capacitor accommodated in the opening 20 of the core substrate has a thickness of 30%-100% of that of the core substrate.

(11) Vacuuming is performed, and a prepreg ($50F\alpha$) of a B-stage, on which a copper foil 49 with a primer is laminated, is press-bonded (laminated) on the first surface (F) of the core substrate 30. By hot pressing, resin seeps out from the prepreg into the opening, and the opening 20 is filled with a filler (resin filler) 50 (FIG. 3F). It is desirable that the copper foil 49 have a thickness of 1 μm or more and 3 μm or less. When the thickness of the copper foil 49 is less than 1 μm, the copper foil 49 is hardly effective as a mask when laser is applied (to be described later). When the thickness of the copper foil 49 is more than 3 μm, it is difficult to remove the copper foil 49 by etching. A spacing between an inner wall of the opening and the capacitor is filled with a filler. The capacitor is fixed on the core substrate. The prepreg has a reinforcing material such as a glass cloth. It is preferable that the prepreg contain inorganic particles such as glass particles. The filler contains inorganic particles such as silica.

Figure 4B:
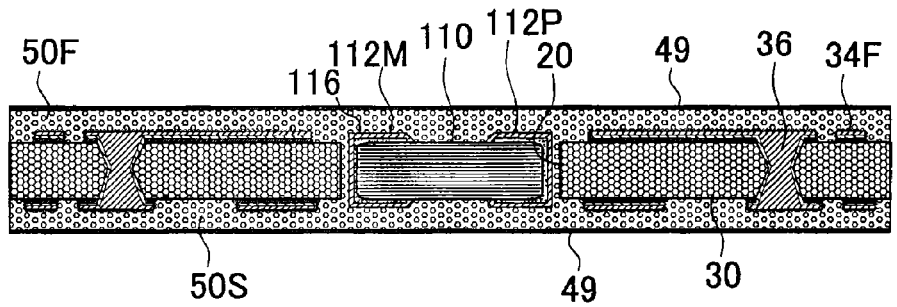

(12) After the tape is peeled off (FIG. 4A), vacuuming is performed, and a prepreg of a B-stage, on which a copper foil 49 with a primer is laminated, is press-bonded on the second surface (S) of the core substrate 30. The prepregs on the first surface and the second surface of the core substrate are cured. Insulating layers (interlayer resin insulating layers) (50F, 50S) are formed on the first surface and the second surface of the core substrate (FIG. 4B). Here, when the core substrate and the interlayer resin insulating layer are laminated, vacuuming is performed. Therefore, adhesion between the two is high. On the other hand, as described above, the Ni paste is used for the electrodes of the capacitor. Since the Ni paste does not contain a glass component, glass pores do not exist; and even in a vacuum state when the lamination is performed, there is no scattering of potassium ions that are from the pores and originate from potassium pyrophosphate when the Cu plating film 116 is formed, and it does not become cause for migration between the electrodes (112P, 112M).

Figure 4C:
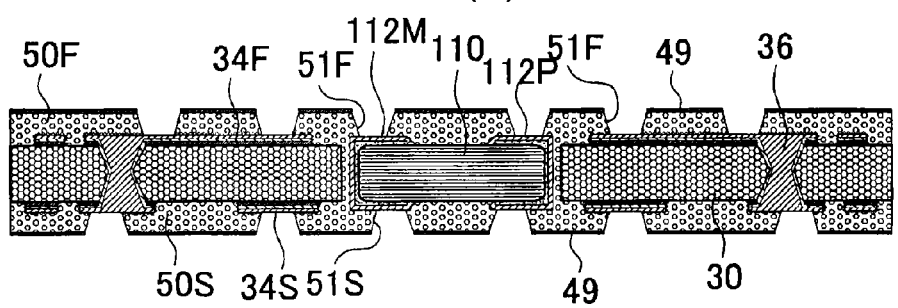

(13) Openings (51F) for via conductors reaching the electrodes (112P, 112M) of the capacitor 110, the conductor layer (34F) and the through hole conductor 36 are formed on the insulating layer (50F) using $CO_2$ gas laser from the first surface side. Openings (51S) for via conductors reaching the electrodes (112P, 112M) of the capacitor 110, the conductor layer (34S) and the through hole conductor 36 are formed on the insulating layer (50S) from the second surface side (FIG. 4C).

Figure 4D:
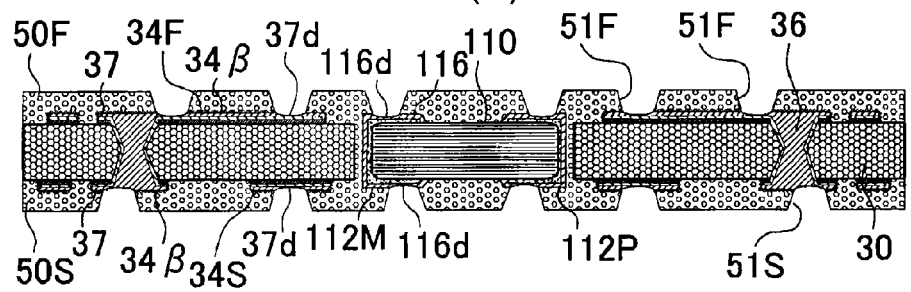

(14) By etching, the copper foil 49 is removed to expose the primers of the surfaces of the insulating layers (50F, 50S), and, recesses (116d) are formed on the terminals (112M, 112P) at bottom parts of the openings (51F, 51S) for via conductors and recesses (37d) are formed on the conductor patterns (34F, 34S) at bottom parts of the openings (51F, 51S) for via conductors (FIG. 4D). As described above with reference to FIG. 1B, the depth d1 of the recesses (37d) of the conductor patterns (34F, 34S) is deeper than the depth (d2) of the recesses (116d) of the terminals (112M, 112P) of the capacitor. This is because the electrolytic plating films 37 of the surface layers of the conductor patterns (34F, 34S) that are formed by the electrolytic plating processing using copper sulfate are easier to be etched than the Cu plating films 116 of the surface layers of the terminals (112M, 112P) that are formed by the copper pyrophosphate plating. In the first embodiment, by using different methods for manufacturing the electrolytic plating films 37 of the surface layers of the conductor patterns (34F, 34S) and the Cu plating films 116 of the surface layers of the terminals (112M, 112P), the depth d1 of the recesses (37d) and the depth (d2) of the recesses (116d) are adjusted by the same etching processing.

As described above with reference to FIG. 3B, the surface of the core substrate is subjected to a roughening treatment for enhancing adhesion with the interlayer resin insulating layer, and the roughened layers (34β) are formed on the surfaces of the conductor patterns (34F, 34S). When the openings (51F, 51S) for via conductors are provided using laser, residues are more likely to remain on the conductor patterns (34F, 34S) than the terminals (112M, 112P) that are not subjected to the roughening treatment. Therefore, by making the depth of the recesses (37d) of the conductor patterns (34F, 34S) on the core substrate deeper than the depth of the recesses (116d) of the terminals (112M, 112P), the residues of the bottom parts of the openings for via conductors can be removed and the connection reliability of the via conductors (60F, 60S) that connect to the conductor patterns (34F, 34S) that are formed in a process to be described later can be improved.

Figure 4E:
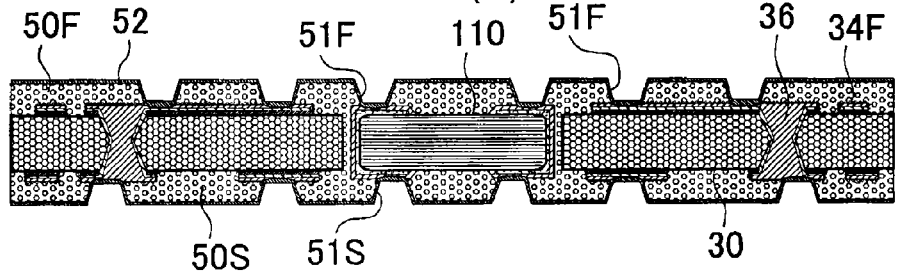
Figure 5A:
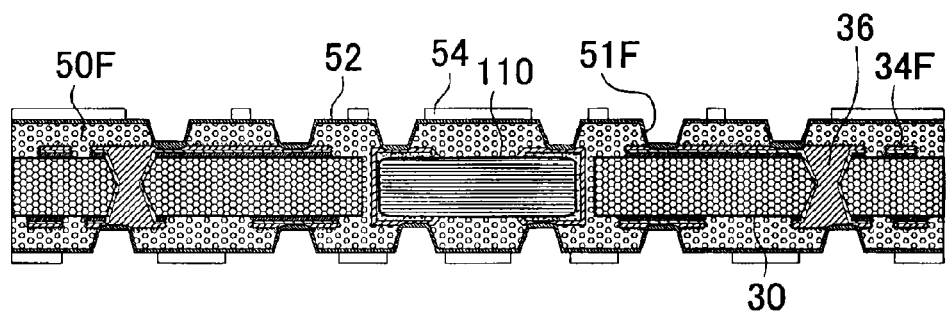
FIG. 5A-5C illustrate manufacturing process diagrams of the substrate with a built-in electronic component of the first embodiment.

(15) By an electroless plating processing, an electroless plating film 52 is formed on an inner wall of the opening for a via conductor and on the insulating layer (FIG. 4E).
(16) A plating resist 54 is formed on the electroless plating film 52 (FIG. 5A).

Figure 5B:
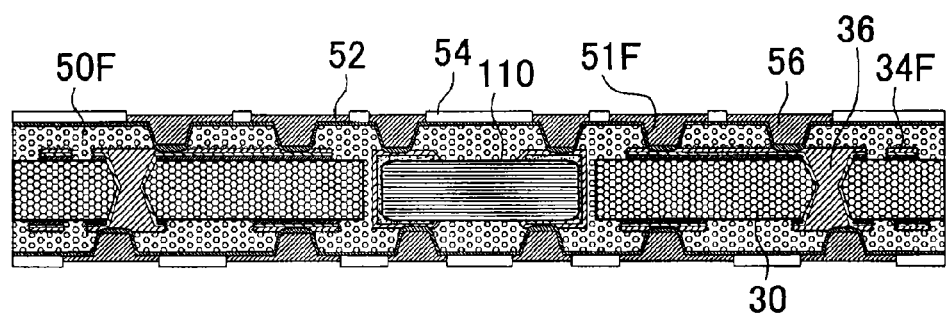
Figure 5C:
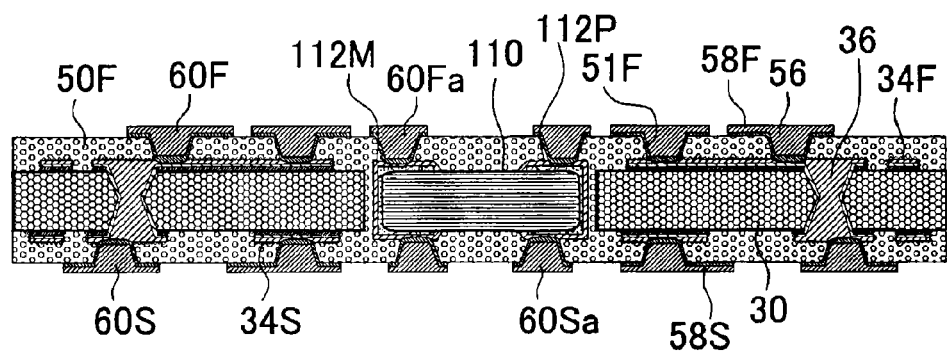
Figure 6A:
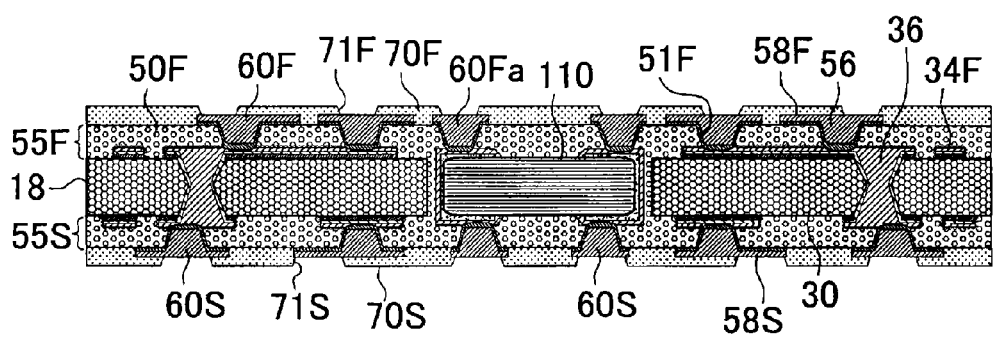
FIGS. 6A and 6B illustrate manufacturing process diagrams of the substrate with a built-in electronic component of the first embodiment.
Figure 6B:
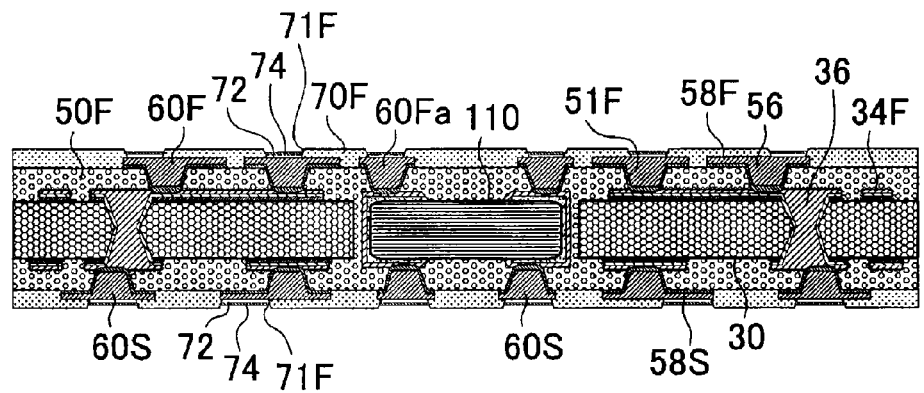

(17) Next, by an electrolytic plating processing, an electrolytic plating film 56 is formed on the electroless plating film that is exposed from the plating resist (FIG. 5B).
(18) Next, the plating resist 54 is removed using an amine solution. Thereafter, the electroless plating film 52 that is exposed from the electrolytic copper plating film is removed by etching, and conductor layers (58F, 58S) that are formed of the electroless plating film 52 and the electrolytic plating film 56 are formed. The conductor layers (58F, 58S) include multiple conductor circuits and via conductor lands. At the same time, via conductors (60F, 60S) and connection via conductors (60Fa, 60Sa) are formed (FIG. 5C). The via conductors (60F, 60S) connect the conductor layer and the through hole conductor of the core substrate to the conductor layers (58F, 58S) on the insulating layers. The connection via conductors (60Fa, 60Sa) connect the electrodes (112P, 112M) of the capacitor to the conductor layer (58F, 58S) on the insulating layer.
(19) On an upper side build-up layer (55F), a solder resist layer (70F) having openings (71F) is formed. On a lower side build-up layer (55S), a solder resist layer (70S) having openings (71S) is formed (FIG. 6A). The openings (71F, 71S) expose upper surfaces of the conductor layers and the via conductors. The exposed portions function as pads.
(20) On a pad, a metal film is formed that includes a nickel layer 72 and a gold layer 74 on the nickel layer 72 (FIG. 6B). Other than the nickel-gold layers, a metal film formed of nickel-palladium-gold layers may also be adopted.
(21) Thereafter, solder bumps (76F) are formed on the pads of the upper side build-up layer (55F); and solder bumps (76S) are formed on the pads of the lower side build-up layer (55S). The substrate 100 with a built-in electronic component having the solder bumps is completed (FIG. 1A).

Via the solder bumps (76F), an IC chip (not illustrated in the drawings) is mounted on the substrate 100 with a built-in electronic component. Thereafter, via the solder bumps (76S), the substrate with a built-in electronic component is mounted on a motherboard.

In a package substrate for mounting a CPU, in order to enhance supply power to the CPU, a chip capacitor may be surface-mounted. To shorten a wiring length between the CPU and the chip capacitor and further to stabilize a voltage of the supply power, the chip capacitor may be built-in in the package substrate.

When a conductor pattern and an electrode of the capacitor are connected by a via conductor formed in the interlayer resin insulating layer, connection reliability of the via conductor is low.

A substrate with a built-in electronic component according to an embodiment of the present invention and a method for manufacturing a substrate with a built-in electronic component according to an embodiment of the present invention have high connection reliability of a via conductor.

In a substrate with a built-in electronic component according to an embodiment of the present invention, an electronic component having a terminal is accommodated in an opening of an insulating substrate having a conductor pattern; an insulating layer is covered on the insulating substrate and the electronic component; and via conductors that penetrate through the insulating layer and reach the conductor pattern and the terminal are provided. A connecting part of the via conductor and the conductor pattern and a connecting part of the via conductor and the terminal are recessed, and a depth of a recess of the connecting part of the conductor pattern is deeper than a depth of a recess of the connecting part of the terminal.

A method for manufacturing the substrate with a built-in electronic component according to an embodiment of the present invention includes: forming a conductor pattern on an insulating substrate; forming an opening on the insulating substrate; accommodating an electronic component having a terminal in the opening of the insulating substrate; laminating an insulating layer and a copper foil on the insulating substrate and the electronic component; providing, using laser, openings for vias that penetrate through the copper foil and the insulating layer and reach the conductor pattern and the terminal; by etching, removing the copper foil, and forming a recess on the terminal at a bottom part of the opening for a via and forming a recess, which is deeper than the recess of the terminal, on the conductor pattern at a bottom part of the opening for a via; and providing via conductors in the openings for vias by plating.

In a substrate with a built-in electronic component according to an embodiment of the present invention, a connecting part of the via conductor and the conductor pattern and a connecting part of the via conductor and the terminal are recessed, and the depth of the recess of the conductor pattern on a resin core substrate is deeper than the depth of the recess of the terminal on the electronic component such as a ceramic capacitor. Due to a difference between coefficients of thermal expansion of an interlayer resin insulating layer and the core substrate, a tensile stress is large in the conductor pattern on the resin core substrate, and the conductor pattern on the resin core substrate also has a large amount of displacement. On the other hand, the terminal on a highly rigid ceramic has a small amount of displacement. Therefore, by allowing the via conductor to significantly protrude into the conductor pattern and deepening the recess, the connection reliability of the via conductor that connects to the conductor pattern can be improved.

In a method for manufacturing the substrate with a built-in electronic component according to an embodiment of the present invention, a connecting part of the via conductor and the conductor pattern and a connecting part of the via conductor and the terminal are recessed, and the depth of the recess of the conductor pattern on the resin core substrate is deeper than the depth of the recess of the terminal on the electronic component such as a ceramic capacitor. Due to a difference between coefficients of thermal expansion of an interlayer resin insulating layer and the core substrate, a tensile stress is large in the conductor pattern on the resin core substrate, and the conductor pattern on the resin core substrate also has a large amount of displacement. On the other hand, the terminal on a highly rigid ceramic has a small amount of displacement. Therefore, by allowing the via conductor to significantly protrude into the conductor pattern and deepening the recess, the connection reliability of the via conductor that connects to the conductor pattern can be improved.

Further, it is desirable that a surface of the core substrate be subjected to roughening treatment for enhancing adhesion with the interlayer resin insulating layer. However, when the opening for a via is provided using laser, residues are more likely to remain on the conductor pattern than on the terminal that is not subjected to a roughening treatment. Therefore, by making the depth of the recess of the conductor pattern on the core substrate deeper than the depth of the recess of the terminal, the residues of the bottom part of the opening for a via is removed and the connection reliability of the via conductor that connects to the conductor pattern is improved.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate having a built-in electronic component, comprising:
   an insulating substrate having an opening portion;
   a conductor pattern formed on the insulating substrate;
   an electronic component accommodated in the opening portion of the insulating substrate and having a terminal;
   an insulating layer formed on the insulating substrate such that the insulating layer is covering the conductor pattern on the insulating substrate and the electronic component in the opening portion of the insulating substrate; and
   a plurality of via conductors penetrating through the insulating layer and comprising a first via conductor reaching to the conductor pattern on the insulating substrate and a second via conductor reaching to the terminal of the electronic component in the opening portion of the insulating substrate,
   wherein the conductive pattern has a recessed connecting portion connected to the first via conductor, the terminal of the electronic component has a recessed connecting portion connected to the second via conductor, and the recessed connecting portion of the conductor pattern has a depth which is greater than a depth of the recessed connecting portion of the terminal of the electronic component.

2. A substrate having a built-in electronic component according to claim 1, wherein the electronic component is a multilayer ceramic capacitor.

3. A substrate having a built-in electronic component according to claim 2, wherein the insulating substrate comprises a core substrate, and the core substrate has a coefficient of thermal expansion in an X-Y direction which is smaller than a coefficient of thermal expansion in the X-Y direction of the multilayer ceramic capacitor.

4. A substrate having a built-in electronic component according to claim 1, wherein the recessed connecting portion of the conductor pattern and the recessed connecting portion of the terminal are formed such that a ratio of the recessed connecting portion of the conductor pattern and the recessed connecting portion of the terminal is in a range of from 0.5 or more to less than 1.0.

5. A substrate having a built-in electronic component according to claim 1, wherein the conductor pattern comprises a copper foil portion, an electroless plating conductor layer and a copper sulfate plating layer, and the terminal comprises a copper pyrophosphate plating layer.

6. A substrate having a built-in electronic component according to claim 5, wherein the conductor pattern has the recessed connecting portion formed in the copper sulfate plating layer, and the terminal has the recessed connecting portion formed in the copper pyrophosphate plating layer.

7. A substrate having a built-in electronic component according to claim 1, wherein the conductor pattern comprises a copper sulfate plating layer, and the terminal comprises a copper pyrophosphate plating layer.

8. A substrate having a built-in electronic component according to claim 7, wherein the conductor pattern has the recessed connecting portion formed in the copper sulfate plating layer, and the terminal has the recessed connecting portion formed in the copper pyrophosphate plating layer.

9. A substrate having a built-in electronic component according to claim 6, wherein the recessed connecting portion of the conductor pattern and the recessed connecting portion of the terminal are formed such that a ratio of the recessed connecting portion of the conductor pattern and the recessed connecting portion of the terminal is in a range of from 0.5 or more to less than 1.0.

10. A substrate having a built-in electronic component according to claim 8, wherein the recessed connecting portion of the conductor pattern and the recessed connecting portion of the terminal are formed such that a ratio of the recessed connecting portion of the conductor pattern and the recessed connecting portion of the terminal is in a range of from 0.5 or more to less than 1.0.

11. A substrate having a built-in electronic component according to claim 2, wherein the insulating substrate has a coefficient of thermal expansion in an X-Y direction which is smaller than a coefficient of thermal expansion in the X-Y direction of the multilayer ceramic capacitor.

12. A substrate having a built-in electronic component according to claim 4, wherein the insulating substrate has a coefficient of thermal expansion in an X-Y direction which is smaller than a coefficient of thermal expansion in the X-Y direction of the multilayer ceramic capacitor.

13. A substrate having a built-in electronic component according to claim 1, wherein the conductor pattern has a roughened surface.

14. A method for manufacturing a substrate having a built-in electronic component, comprising:
   forming a conductor pattern on an insulating substrate;
   forming an opening portion in the insulating substrate;
   accommodating an electronic component having a terminal in the opening portion of the insulating substrate;
   laminating an insulating layer on the insulating substrate such that the insulating layer covers the conductor pattern on the insulating substrate and the electronic component in the opening portion of the insulating substrate;
   laminating a copper foil on the insulating layer;
   irradiating laser upon the copper foil such that a plurality of openings including a first opening penetrating through the copper foil and the insulating layer and reaching to the conductor pattern and a second opening penetrating through the copper foil and the insulating layer and reaching to the terminal of the electronic component is formed;
   applying etching on the copper foil such that the copper foil is removed from the insulating layer, a recessed connecting portion is formed on the terminal, and a recessed connecting portion is formed on the conductor pattern such that the recessed connecting portion of the conductor pattern has a depth which is greater than a depth of the recessed connecting portion of the terminal; and
   forming a plurality of via conductors comprising a first via conductor formed in the first opening such that the first via conductor connects to the recessed connecting portion of the conductor pattern and a second via conductor formed in the second opening such that the second via conductor connects to the recessed connecting portion of the terminal of the electronic component.

15. A method for manufacturing a substrate having a built-in electronic component according to claim 14, wherein the forming of the conductor pattern comprises forming a copper sulfate plating layer, and the terminal of the electronic component comprises a copper pyrophosphate plating layer.

16. A method for manufacturing a substrate having a built-in electronic component according to claim 14, wherein the forming of the conductor pattern comprises forming a copper foil portion, an electroless plating conductor layer and a copper sulfate plating layer, and the terminal of the electronic component comprises a copper pyrophosphate plating layer.

17. A method for manufacturing a substrate having a built-in electronic component according to claim 14, wherein the copper foil has a primer.

18. A method for manufacturing a substrate having a built-in electronic component according to claim 14, further comprising:
   applying roughening treatment to the conductor pattern.

19. A method for manufacturing a substrate having a built-in electronic component according to claim 14, wherein the copper foil has a thickness in a range of from 1 μm or more to 5 μm or less.

20. A method for manufacturing a substrate having a built-in electronic component according to claim 14, wherein the applying of etching comprises forming the recessed connecting portion of the conductor pattern and the recess connecting portion of the terminal such that a ratio of the recessed connecting portion of the conductor pattern and the recess connecting portion of the terminal is in a range of 0.5 or more to less than 1.0.

* * * * *